(12) United States Patent
Wu (10) Patent No.: US 11,469,528 B1
(45) Date of Patent: Oct. 11, 2022

(54) TERMINAL BLOCK WITH ELASTIC RETRACTING FIXATION MEMBER

(71) Applicants: DINKLE ENTERPRISE CO., LTD., New Taipei (TW); DINKLE ELECTRIC MACHINERY (CHINA) CO., LTD., Jiangsu (CN)

(72) Inventor: Shang-Tsai Wu, New Taipei (TW)

(73) Assignees: DINKLE ENTERPRISE CO., LTD., New Taipei (TW); DINKLE ELECTRIC MACHINERY (CHINA) CO., LTD., Jiangsu (CN)

( * ) Notice: Subject to any disclaimer, the term of this patent is extended or adjusted under 35 U.S.C. 154(b) by 64 days.

(21) Appl. No.: 17/243,543

(22) Filed: Apr. 28, 2021

(51) Int. Cl.
H05K 5/00 (2006.01)
H01R 9/24 (2006.01)

(52) U.S. Cl.
CPC ......... H01R 9/2408 (2013.01); H01R 9/2416 (2013.01)

(58) Field of Classification Search
CPC .......... H02G 5/08; H01H 71/02; H01H 71/10; H01R 25/142
See application file for complete search history.

(56) References Cited

U.S. PATENT DOCUMENTS

| | | | | |
|---|---|---|---|---|
| 4,966,539 A | * | 10/1990 | Pena | B29C 48/45 137/854 |
| 5,333,978 A | * | 8/1994 | Rives | B60Q 1/0433 411/389 |
| 5,833,416 A | * | 11/1998 | Cau | F16B 21/02 296/146.7 |
| 6,024,600 A | * | 2/2000 | Daoud | F16B 35/041 411/389 |
| 7,364,442 B2 | * | 4/2008 | Bang | H05K 1/119 439/97 |

FOREIGN PATENT DOCUMENTS

| | | |
|---|---|---|
| CN | 104466443 A | 3/2015 |
| DE | 3805970 A1 | 9/1988 |
| DE | 102018124583 A1 | 4/2019 |

OTHER PUBLICATIONS

Office Action dated Apr. 30, 2022 of the corresponding German patent application No. 102021113847.7.

* cited by examiner

Primary Examiner — Phuong Chi Thi Nguyen
(74) Attorney, Agent, or Firm — Chun-Ming Shih; HDLS IPR Services (57) ABSTRACT

A terminal block (1) with an elastic retracting fixation member, including an insulation base (10) having a cavity (13) and a cable insertion slot (14) communicating with the cavity (13), a cover member (20) covering the insulation base (10) and having a tool access hole (23), a conductive assembly (30) arranged in the cavity (13) and having a carrying member (32), and an elastic retracting fixation member (40) arranged corresponding to the tool access hole (23) and having an elastic element (41) and a fixation element (42), the elastic element (41) arranged between the fixation element (42) and the cover member (20), the fixation element (42) being operatively disengaged from the cover member (20) to attach to the carrying member (32) and retracting into the cover member (20) via a recovery force of the elastic element (41). Accordingly, it is able to prevent disengagement of the fixation member effectively.

16 Claims, 10 Drawing Sheets

TERMINAL BLOCK WITH ELASTIC RETRACTING FIXATION MEMBER

BACKGROUND

Technical Field

The technical field relates to a terminal block, and in particular, to a terminal block with an elastic retracting fixation member.

Description of Related Art

Terminal blocks are known to be widely used in all kinds of machines and equipment, such as industrial computer, uninterruptible power system (UPS) and power supply, industrial control equipment, such as electro-mechanical system, air conditioning system or programmable controller, or appliances, such as air conditioner, refrigerator, washing machine and oven, etc. The main purpose of terminal blocks is used as an electrical connection device capable of achieving electrical connection of cables and wires.

A related-art terminal block mainly includes an insulation base, an electrical conduction assembly and a top cover. The insulation base includes a cable insertion slot, and the electrical conduction assembly is secured inside the insulation base. In addition, the electrical conduction assembly also includes a conductive plate, a screw shaft connected to the conductive plate and a nut fastened onto the corresponding screw shaft. The top cover is mounted on the top of the insulation base. During the cable connection, the top cover is required to be opened first, and the nut needs to be removed completely, following which a cable is placed in position and the nut is then installed and fastened again at the end.

However, for the related-art terminal block, all of the assembly components are independent from each other such that the drawbacks of complicated cable connection process, inconvenient and time-consuming wiring often occur, leading high labor cost. Furthermore, after the nut is removed, falling off of the nut into equipment or loss of nut also occurs frequently, leading to difficulty in searching of such missing nut and potential safety concern when the nut is left inside the equipment.

In view of the above, the inventor seeks to overcome the aforementioned drawbacks associated with the related-art terminal block and aims to provide an effective solution through extensive researches along with utilization of academic principles and knowledge.

SUMMARY OF PRESENT DISCLOSURE

An objective of the present disclosure is to provide a terminal block with an elastic retracting fixation member. During the assembly and replacement processes of the terminal block, it is able to effectively prevent disengagement of the fixation member, thereby reducing the risk of loss of parts or the risk of parts falling into machine or equipment.

To achieve the aforementioned objective, the present disclosure provides a terminal block with an elastic retracting fixation member having an insulation base, a cover member, a conductive assembly and an elastic retracting fixation member. The insulation base includes a cavity and a cable insertion slot communicating with the cavity. The cover member covers the insulation base, and the cover member includes a tool access hole formed thereon. The conductive assembly is arranged in the cavity of the insulation base, and the conductive assembly includes a carrying member. The elastic retracting fixation member is arranged corresponding to the tool access hole, and the elastic retracting fixation member includes an elastic element and a fixation element. The elastic element is arranged between the fixation element and the cover member. The fixation element is configured to be operably disengaged from the cover member to attach to the carrying member and configured to retract into the cover member via a recovery force of the elastic element after being disengaged from the carrying member.

The present disclosure is able to achieve at least the following technical effects. The present disclosure is able to simplify the wiring steps and to improve the operation efficiency of terminal wiring, thereby reducing time and labor cost required for wiring. After the fixation element and the carrying member are disengaged and retracted, the fixation element is still firmly retained by the elastic element. Therefore, there is no risk of loss of parts or any potential risk associated with the safety of use due to falling off of parts into machine or equipment. Since one end of the elastic element is secured by each of the latch hooks and is configured to surround the outer circumference of the hollow column, after the fixation element and the carrying member are disengaged, it may elastically retract into the tool access hole stably. With the latching assembly between the locking hooks and the locking pieces of the insulation base, the cover may be facilitated to be assembled onto and disengaged from the insulation base.

DETAILED DESCRIPTION

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIG. 1 to FIG. 6, showing a terminal block with an elastic retracting fixation member of the present disclosure. The terminal block 1 mainly includes an insulation base 10, a cover member 20, a conductive assembly 30 and an elastic retracting fixation member 40.

Figure 1:
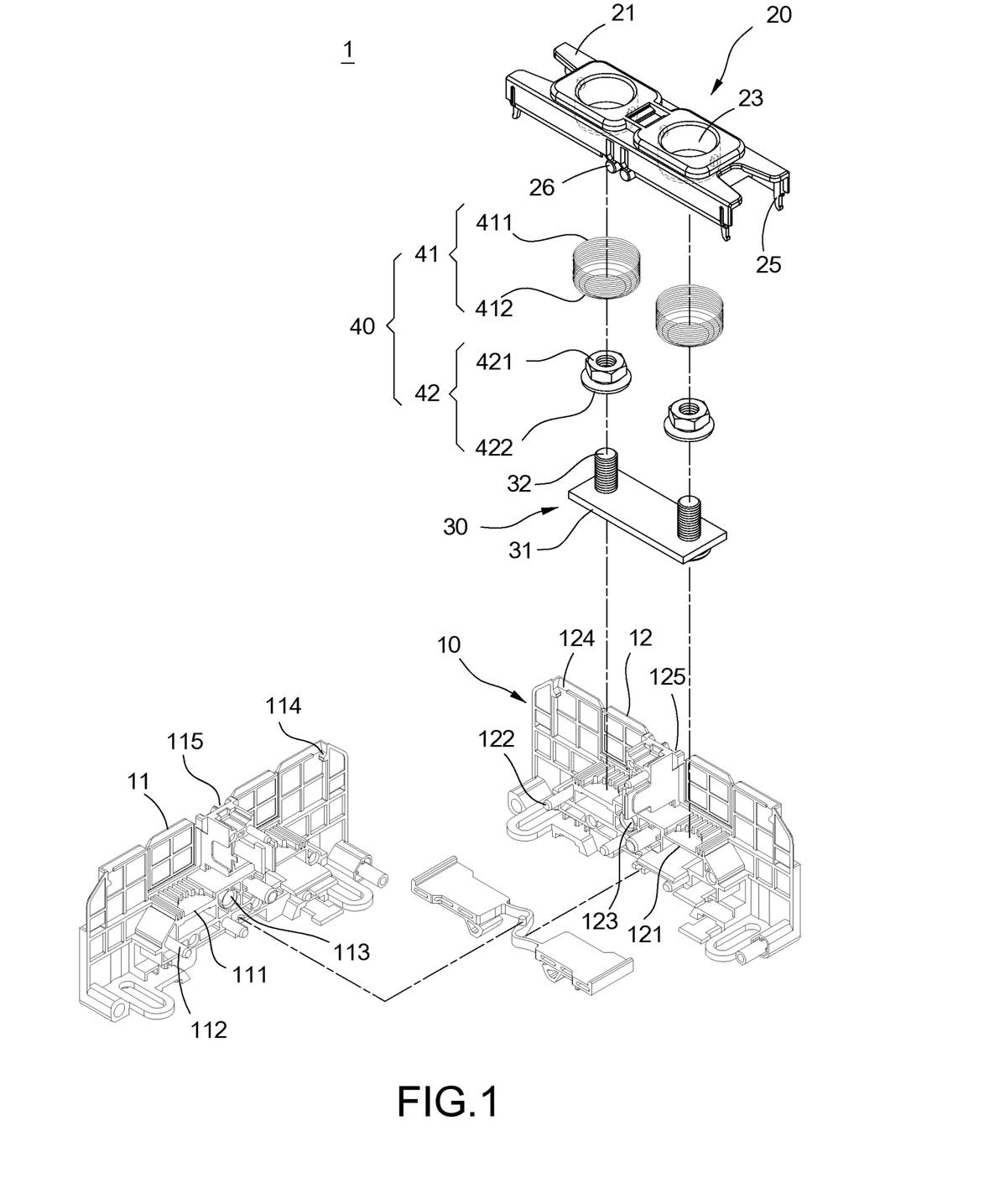
FIG. 1 is an exploded perspective assembly view of the terminal block of the present disclosure.

As shown in FIG. 1, according to an exemplary embodiment, the insulation base 10 may be made of a plastic material of an insulation property, and it mainly includes a front housing 11 and a rear housing 12 assembled onto the rear housing 12 correspondingly. A cavity 13, as shown in FIG. 4, is formed in the internal of the front housing 11 and the rear housing 12. In addition, two side edges of the front housing 11 and the rear housing 12 include a cable insertion slot 14, as shown in FIG. 3, formed thereon respectively and communicating with the cavity 13.

Furthermore, the middle section of the front housing 11 includes a placement platform 111 formed thereon. A plurality of insertion pins 112 and a plurality of insertion holes 113 are formed on the side surface of the placement platform 111 and the outer side of the placement platform 111. Similarly, the middle section of the rear housing 12 includes an another placement platform 121 formed thereon. A plurality of insertion pins 122 and a plurality of insertion holes 123 are formed on the side surface of the another placement platform 121 and the outer side of the another placement platform 121. Each one of the insertion pins 112 of the front housing 11 is configured to be inserted and attached to each one of the corresponding insertion holes 123 of the rear housing 12 respectively. Each one of the insertion pins 122 of the rear housing 12 is configured to be inserted and attached to each one of the corresponding insertion holes 113 of the front housing 11 respectively. Furthermore, the placement platforms 111, 121 are arranged in parallel. The cavity 13 is formed on top of each of the placement platforms 111, 121. The cable insertion slot 14 is formed on the side edges of each of the placement platforms 111, 121. In an exemplary embodiment, the quantity of the cable insertion slot 14 is two.

Figure 2:
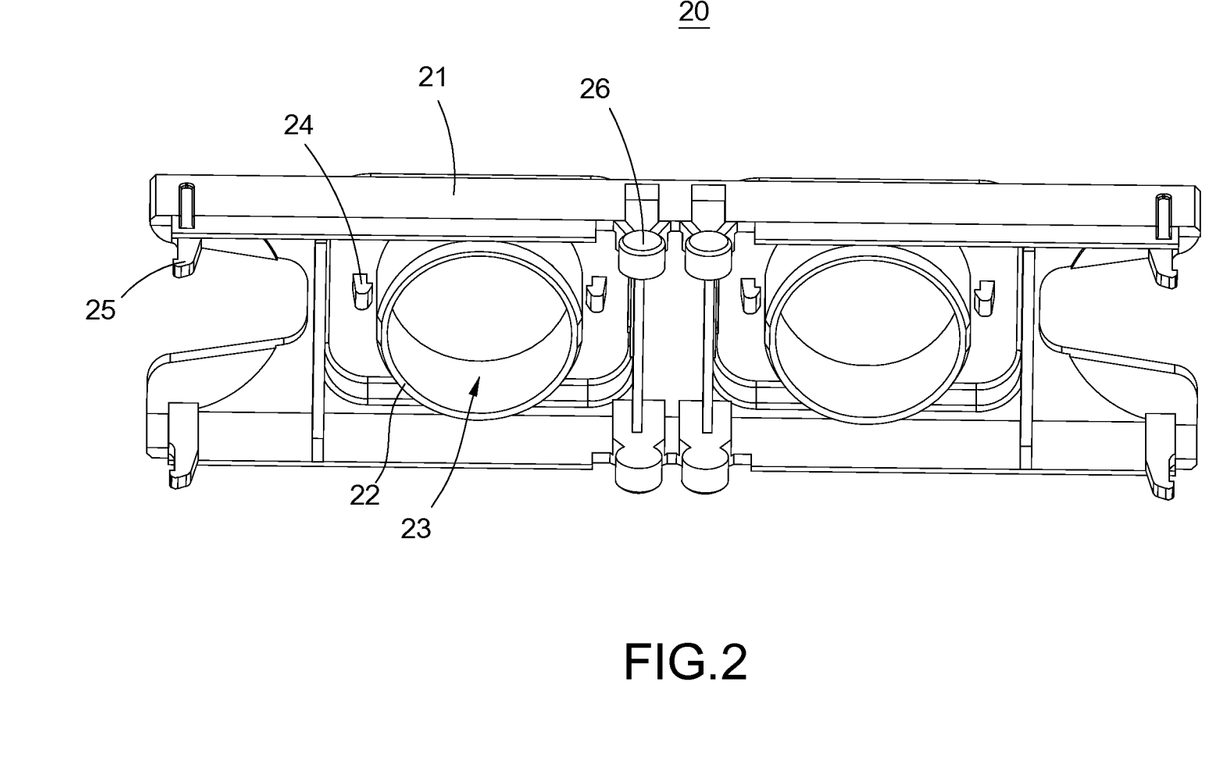
FIG. 2 is a perspective assembly view of the terminal block of the present disclosure.
Figure 3:
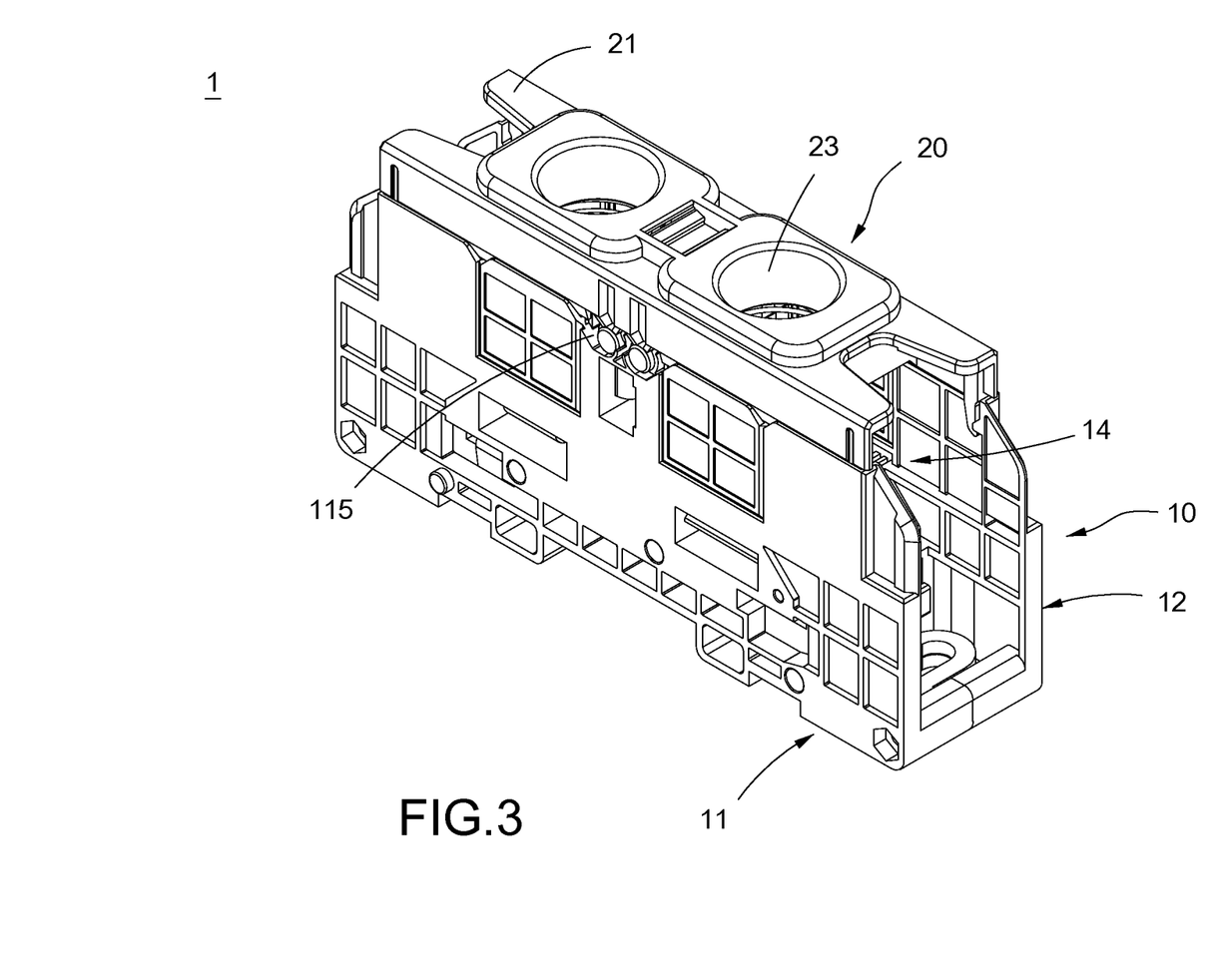
FIG. 3 is a perspective view showing an assembly of the terminal block of the present disclosure.
Figure 4:
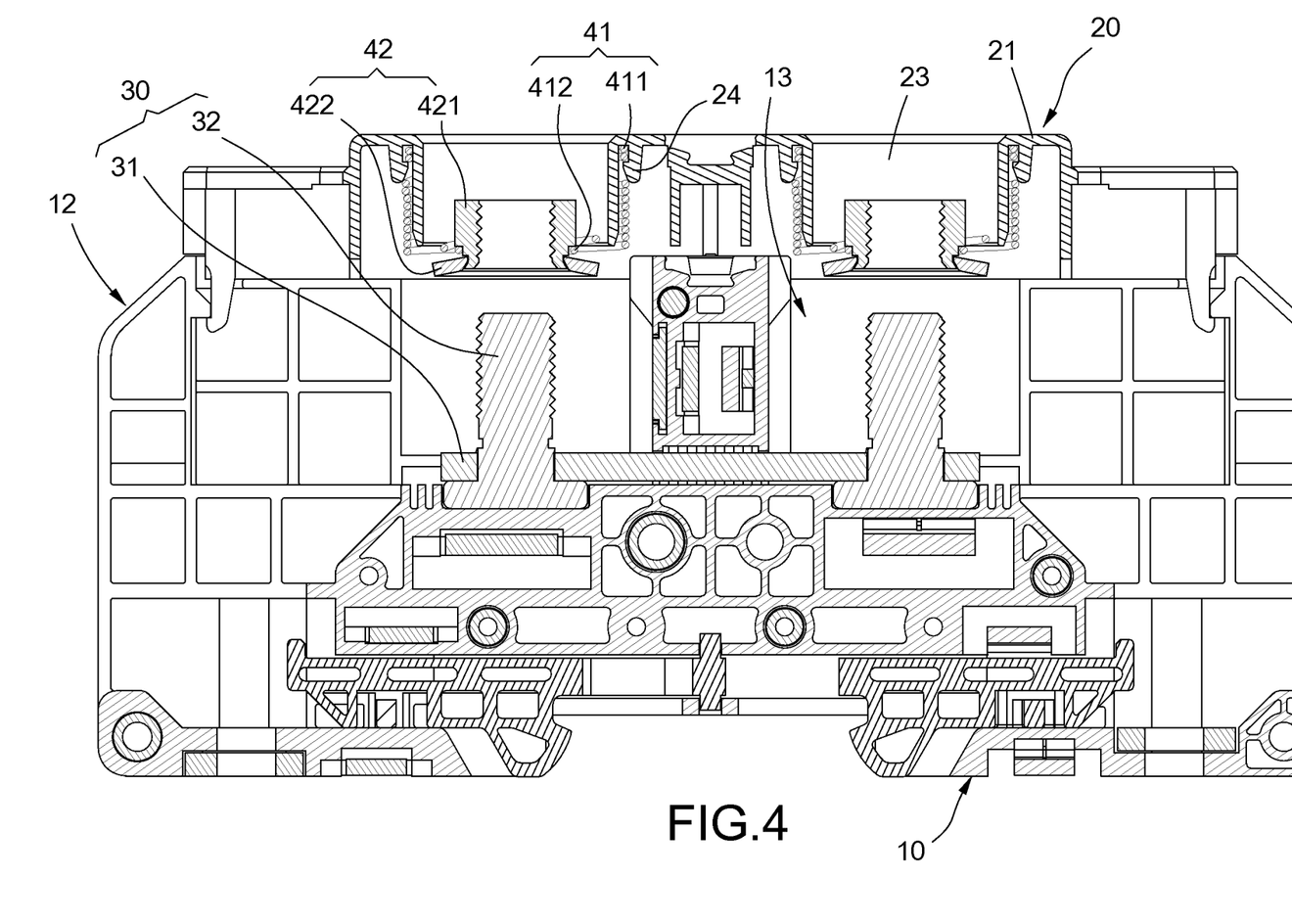
FIG. 4 is a cross sectional view showing an assembly of the terminal block of the present disclosure.
Figure 5:
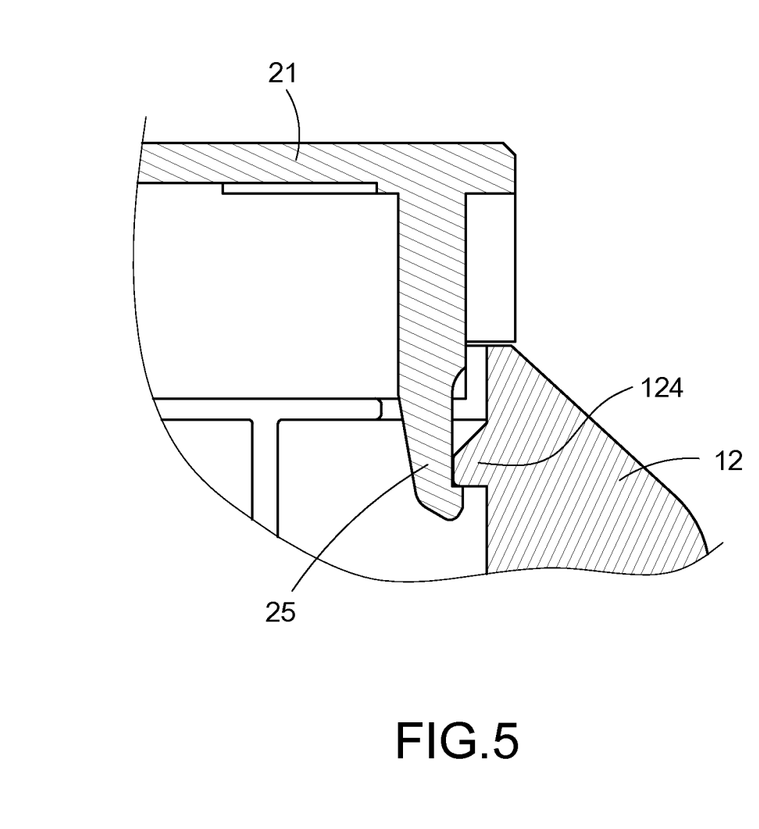
FIG. 5 is a partial cross-sectional view of the present disclosure after the insulation base and the cover member are assembled onto each other.

As shown in FIG. 2, FIG. 3 and FIG. 5, the cover member 20 covers the insulation base 10, and it mainly includes a bracket 21 in an elongated rectangular shape. The bracket 21 includes two hollow columns 22 extended therefrom, and the center of each one of the hollow columns 22 includes a tool access hole 23 formed thereon respectively. In addition, a latch hook 24 is formed to extend from the corresponding area on the outer perimeter of each one of the hollow columns 22. Furthermore, the four corners of the bracket 21 further include a locking hook 25 formed to extend therefrom respectively. The inner sides of the front housing 11 and the rear housing 12 respectively include a plurality of locking pieces 114, 124 extended therefrom. Each one of the locking pieces 114, 124 is provided to latch and secure each one of the locking hooks 24 thereon, as shown in FIG. 5. Moreover, the middle areas of the two side edges of the bracket 21 respectively include a plurality of engagement axles 26 extended therefrom. The outer sides of the front housing 11 and the rear housing 12 respectively include a plurality of engagement slots 115, 125 formed thereon. Each one of the engagement axles 26 is inserted into each one of the corresponding engagement slots 115, 125 for securement, as shown in FIG. 3.

The conductive assembly 30 may be made of a metal material of an electrical conductivity, and it mainly includes a conductive plate 31 and a plurality of carrying members 32 penetrating through the conductive plate 31. In an exemplary embodiment, the carrying member 32 may be a screw shaft. The conductive assembly 30 is secured onto each one of the placement platforms 111, 121 and is formed inside the cavity 13 of the insulation base 10.

Figure 6:
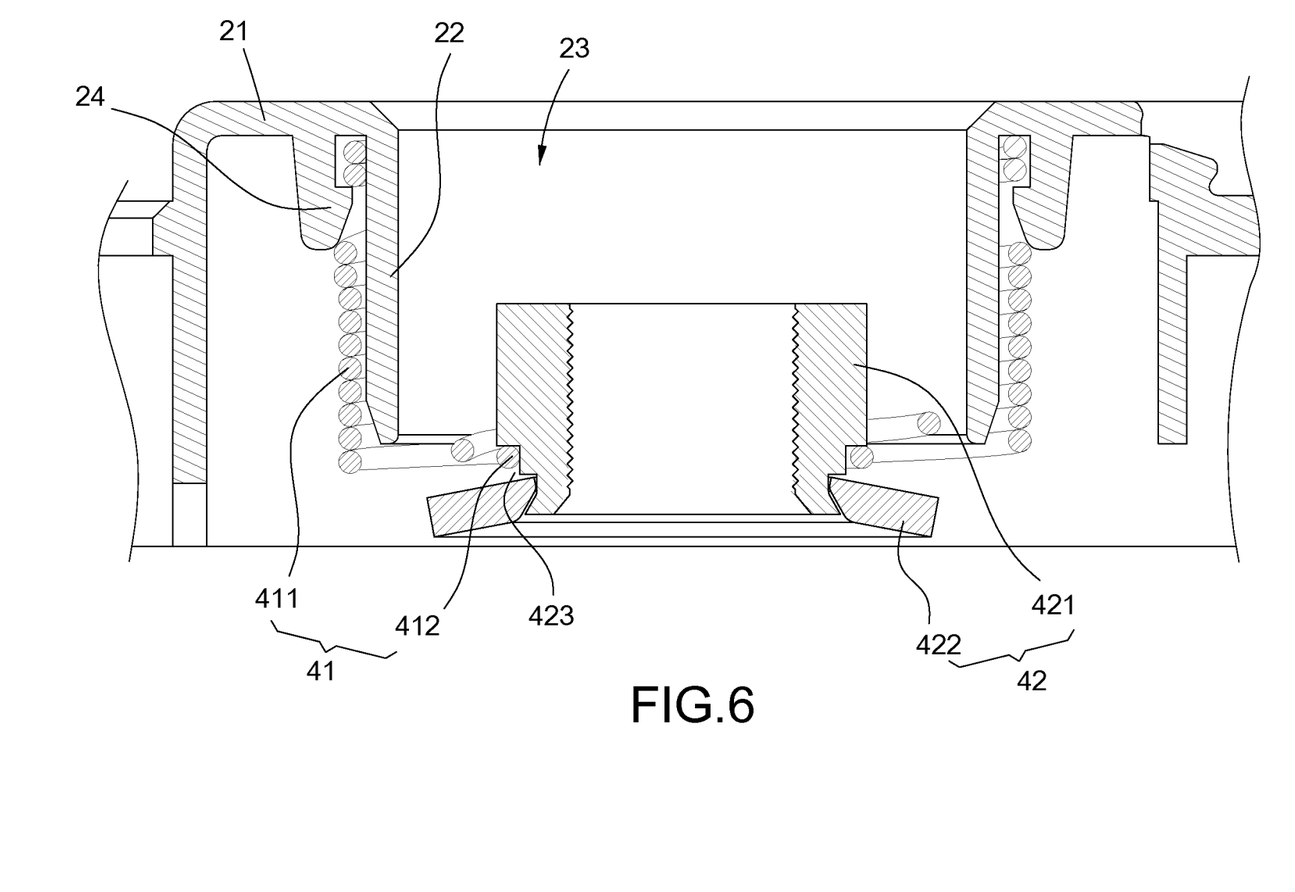
FIG. 6 is a cross sectional view of the present disclosure showing an assembly of the cover member and the elastic retracting fixation member.

As shown in FIG. 3, FIG. 4 and FIG. 6, the elastic retracting fixation member 40 is arranged corresponding to the tool access hole 23, and it mainly comprises an elastic element 41 and a fixation element 42. In an exemplary embodiment, the elastic member 41 may be a coil spring. In an exemplary embodiment, the fixation element 42 may be a nut. The "elastic retracting" refers to that when the fixation element 42 is released, the elastic element 41 is able to cause the fixation element 42 to retract back to the original position.

Furthermore, the elastic element 41 mainly includes a helical section 411 and a fastening ring 412 configured to narrow down from the lower end of the helical section 411. The helical section 411 is mounted onto the outer perimeter of the hollow column 22, and the upper end of the helical section 411 is latched and secured by each one of the latch hooks 24. The fixation element 42 mainly includes a nut body 421 and a retaining ring 422 connected to one end of the nut body 421. A locking slot 423, as shown in FIG. 6, is formed at the outer circumference of the attachment area between the nut body 421 and the retaining ring 422, for the fastening ring 412 to be mounted thereon for securement.

Figure 7:
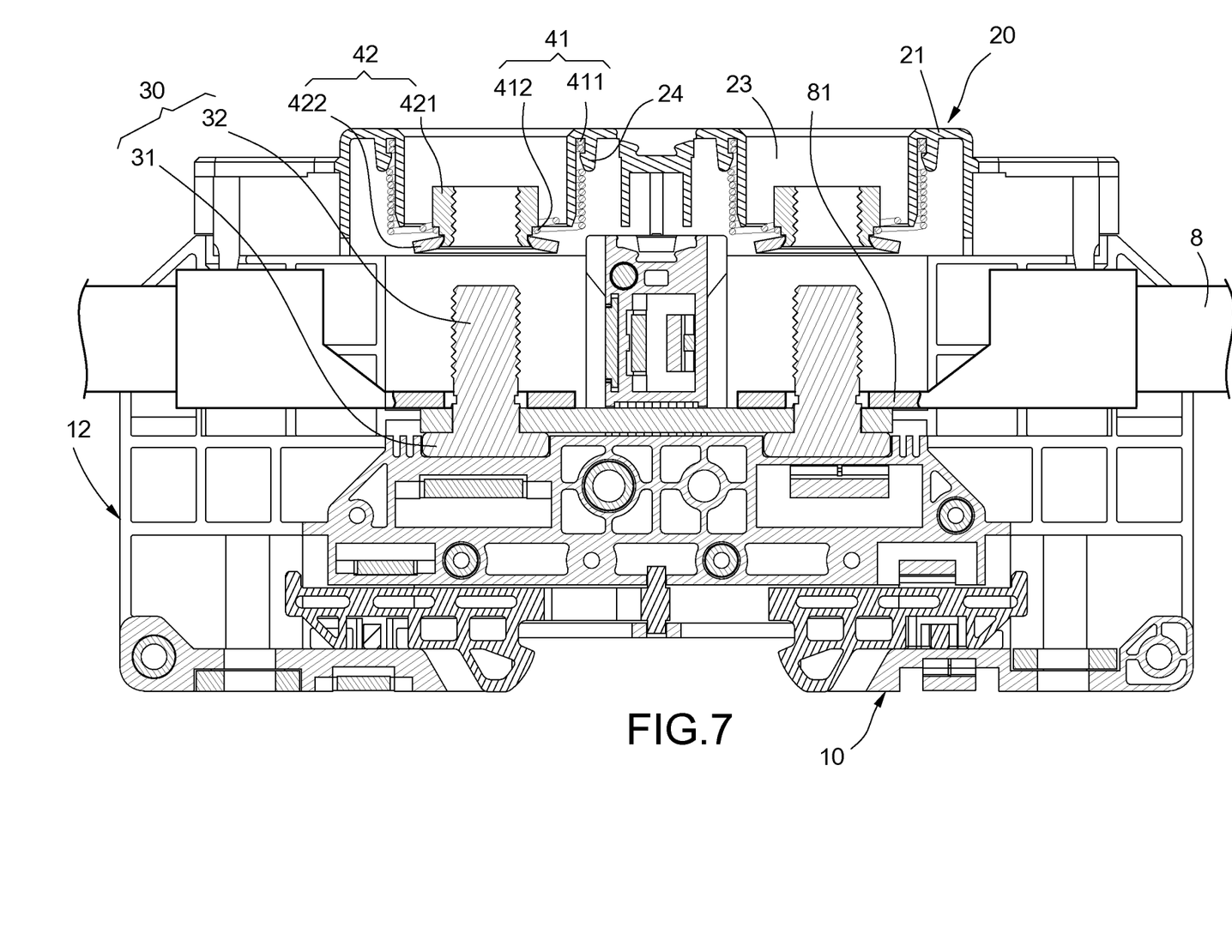
FIG. 7 is a cross sectional view (1) showing a state of use of the terminal block of the present disclosure with cables connected thereto.
Figure 8:
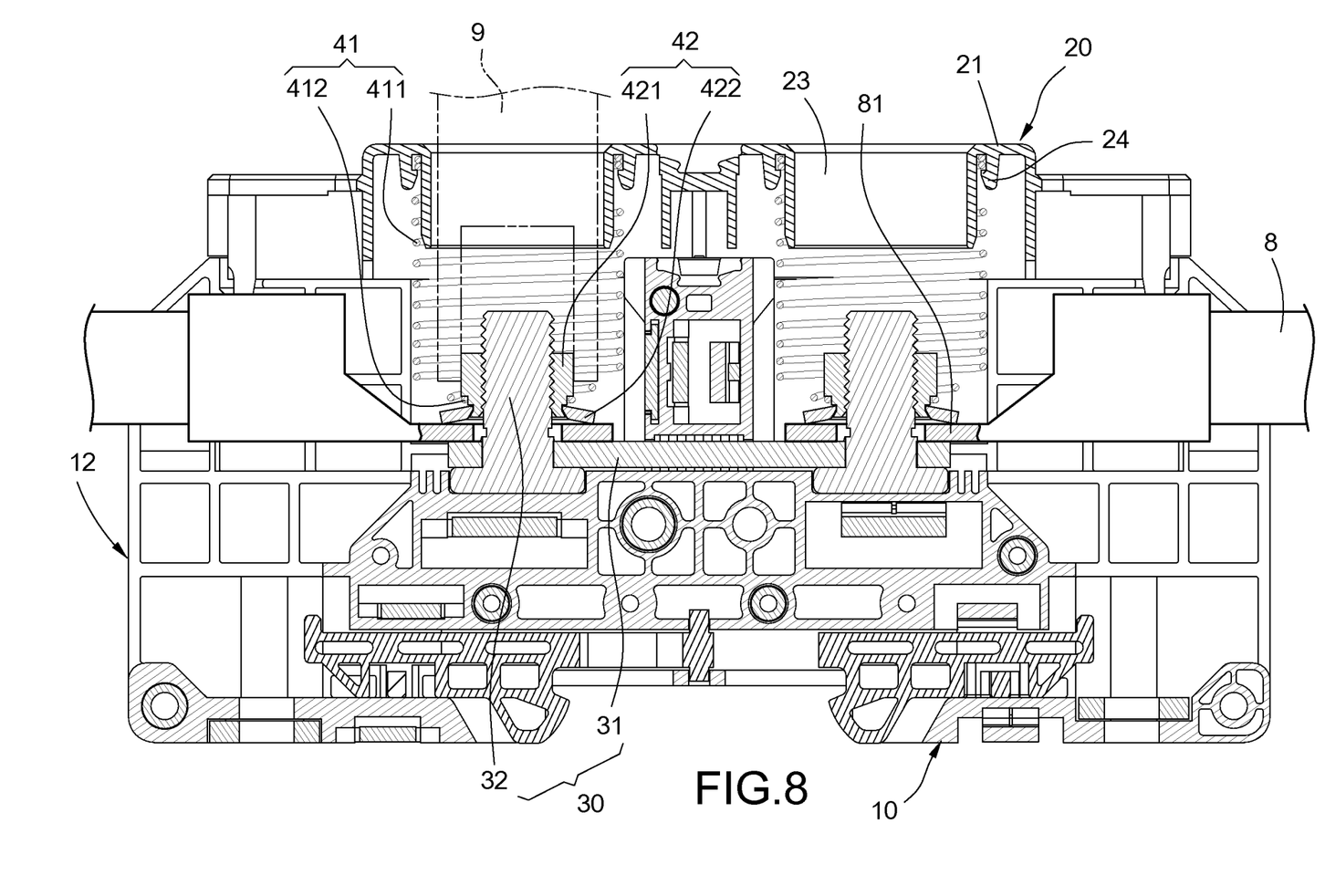
FIG. 8 is a cross sectional view (2) showing a state of use of the terminal block of the present disclosure with cables connected thereto.

As shown in FIG. 7 and FIG. 8, the terminal block 1 of the present disclosure may be provided for a cable 8 to be inserted therein and connected thereto. The end portion of the cable 8 is equipped with a O-type terminal 81. During the attachment, the O-type terminal 81 is inserted into the cable insertion slot 14 and is mounted onto the carrying member 32. A socket wrench 9 is used to penetrate into the tool access hole 23 and is mounted onto the fixation element 42. Next, the fixation element 42 may be operated to move via the cover member 20. In addition, through rotational operation of the socket wrench 9, the O-type terminal 81 may be held between the conductive plate 31 and the fixation element 42. At this time, the elastic element 41 is under the state of being pulled and extended. On the contrary, during disengagement, the socket wrench 9 is used to penetrate into the tool access hole 23, and through the rotational operation of the socket wrench 9, once the fixation element and the carrying member 32 are disengaged and released, the recovery force of the elastic element 41 is able to allow the fixation element 42 to retract back into the tool access hole 23 of the cover member 20. Accordingly, it is able to effectively prevent the fixation element 42 from disengaging from the cover member 20, thereby reducing the risk of loss of the fixation element 42 or falling-off into machine or equipment.

Figure 9:
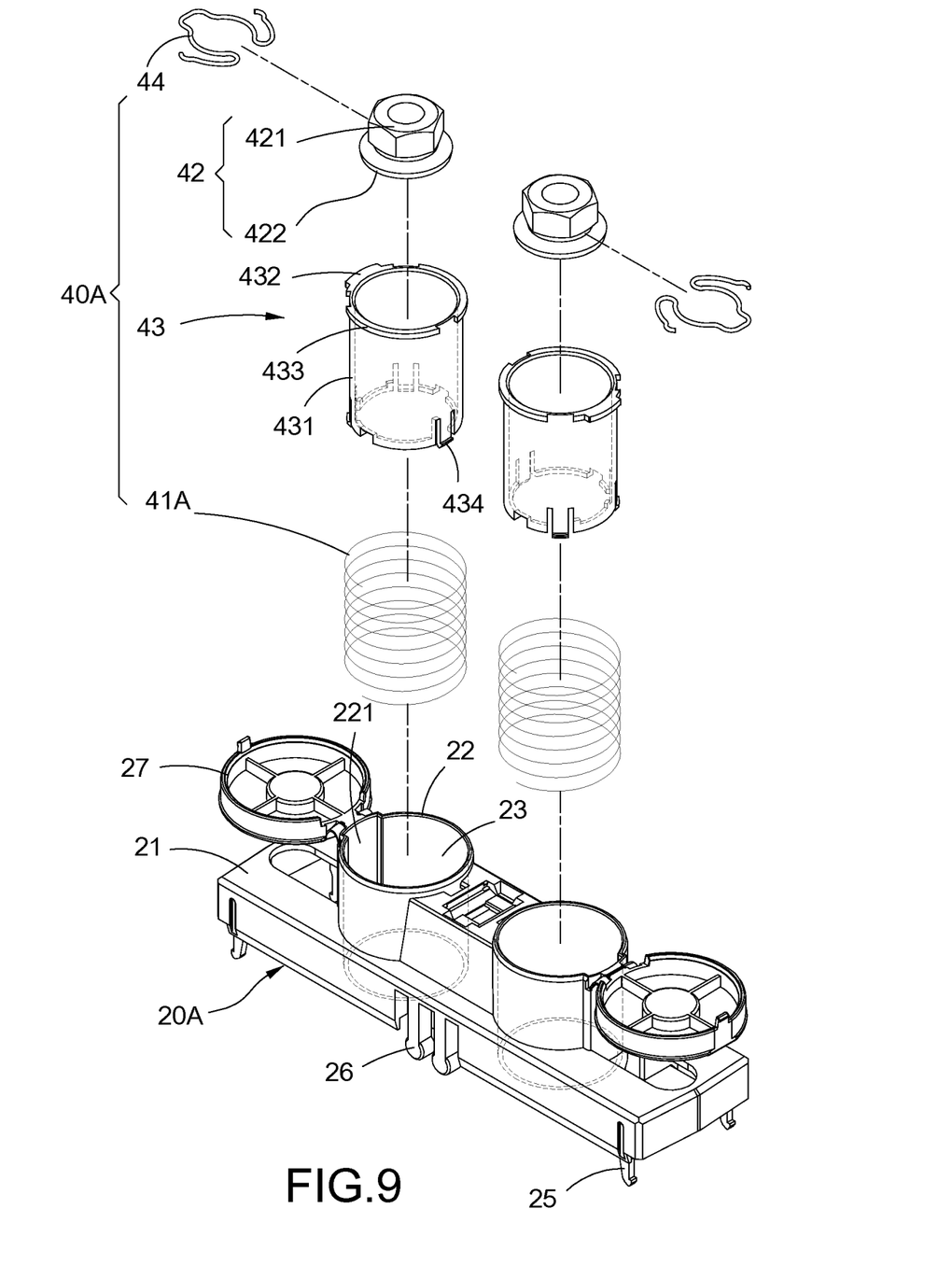
FIG. 9 is an exploded perspective view of the terminal block according to another exemplary embodiment of the present disclosure.

Please refer to FIG. 9, regarding the cover member and the elastic retracting fixation member of the present disclosure, in addition to the possible configurations described in the preceding exemplary embodiments, in another exemplary embodiment, the cover member 20A may further include an anti-dust cover 27. The anti-dust cover 27 is pivotally attached to the side edge of the hollow column 22 and is used to cover the tool access hole 23. In addition, the hollow column 22 further includes a guiding slot 221.

In an exemplary embodiment, the elastic retracting fixation member 40A mainly includes an elastic element 41A, fixation element 42, an inner sleeve 43 and a bow spring 44. The elastic element 41A is a compression helical spring. The inner sleeve 43 mainly includes a cylindrical body 431, a protrusion 432, an upper flange 433 and a lower retaining hook 434. The protrusion 432 extends from one side of a top end of the cylindrical body 431 along a radial direction to cooperatively slide with respect to the guiding slot 221. The upper flange 433 also extends from the top end of the cylindrical body 431 along the radial direction. The lower retaining hook 434 is formed on the bottom end of the cylindrical body 431, and it is used to prevent the inner sleeve 43 from disengaging from the hollow column 22.

The elastic element 41A is mounted at an outer circumference of the inner sleeve 43 and inserted to the hollow column 22 jointly with the inner sleeve 43, thereby allowing the elastic element 41A to be formed between the inner wall of the hollow column 22 and the outer wall of the cylindrical body 431. In addition, the upper end and lower end of the elastic element 41A are also arranged between the upper flange 433 and the lower retaining hook 434. The fixation element 42 is held (clamped) by the bow spring 44 and secured to the bottom end of the cylindrical body 431.

Figure 10:
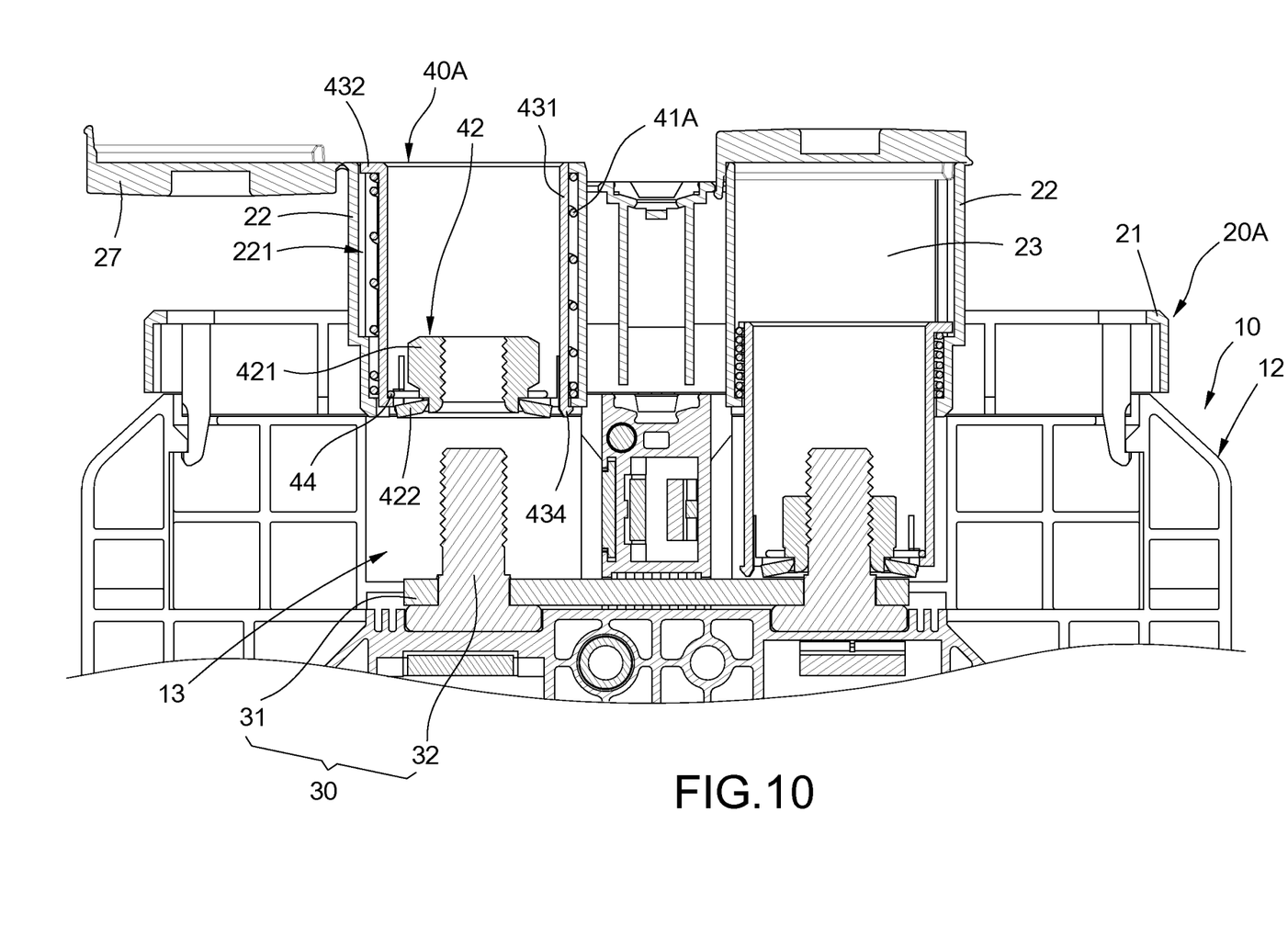
FIG. 10 is a cross sectional view showing a state of use of the terminal block according to another exemplary embodiment of the present disclosure.

As shown in FIG. 10, during attachment, the fixation element 42 is moved in the direction toward the carrying member 32. At this time, the cylindrical body 431 also moves along with the fixation element 42 and compresses the elastic element 41A. On the contrary, during disengagement, the fixation element 42 is disengaged and released from the carrying member 32, and due to the elastic recovery force of the elastic element 41A, the fixation element 42 together with the inner sleeve 43 are able to retract into the tool access hole 23 of the cover member 20A.

In view of the above, the terminal block with an elastic retracting fixation member of the present disclosure is able to achieve the expected purpose of use and to overcome the deficiency of related arts.

What is claimed is:

1. A terminal block (1) with an elastic retracting fixation member, the terminal block (1) comprising:
    an insulation base (10), comprising a cavity (13) and a cable insertion slot (14) communicating with the cavity (13);
    a cover member (20), covering the insulation base (10), and comprising a tool access hole (23) disposed thereon;
    a conductive assembly (30), arranged in the cavity (13) of the insulation base (10), and comprising a carrying member (32); and
    an elastic retracting fixation member (40), arranged corresponding to the tool access hole (23), and comprising an elastic element (41) and a fixation element (42), the elastic element (41) arranged between the fixation element (42) and the cover member (20), the fixation element (42) configured to be operably disengaged from the cover member (20) to attach to the carrying member (32) and configured to retract into the cover member (20) via a recovery force of the elastic element (41) after being disengaged from the carrying member (32).

2. The terminal block (1) with the elastic retracting fixation member according to claim 1, wherein the elastic element (41) comprises a helical section (411) and a fastening ring (412) configured to narrow down from the helical section (411), the fixation element (42) comprises a nut body (421) and a retaining ring (422) connected to the nut body (421), a locking slot (423) is arranged between the nut body (421) and the retaining ring (422), and the fastening ring (412) is mounted and secured in the locking slot (423).

3. The terminal block (1) with the elastic retracting fixation member according to claim 1, wherein the carrying member (32) comprises a screw shaft, the fixation element (42) comprises a nut fastened on the screw shaft, the elastic element (41) comprises a coil spring.

4. The terminal block (1) with the elastic retracting fixation member according to claim 1, wherein the conductive assembly (30) further comprises a conductive plate (31), the carrying member (32) being inserted and attached thereto.

5. The terminal block (1) with the elastic retracting fixation member according to claim 1, wherein a quantity of the tool access hole (23), a quantity of the carrying member (32) and a quantity of the elastic retracting fixation member (40) are equivalent to each other, and all of the quantities are a plural number.

6. The terminal block (1) with the elastic retracting fixation member according to claim 1, wherein the insulation base (10) comprises a front housing (11) and a rear housing (12) assembled on the front housing (11) correspondingly, the front housing (11) comprises a placement platform (111) disposed thereon, the front housing (11) comprises a plurality of insertion pins (112) and a plurality of insertion holes (113) disposed around the placement platform (111), the rear housing (12) comprises an another placement platform (121) disposed thereon, the rear housing (12) comprises a plurality of another insertion pins (122) and a plurality of another insertion holes (123) disposed around the another placement platform (121), the placement platform (111) is configured to attach to the another placement platform (121) correspondingly, each one of the insertion pins (112) and each one of the insertion holes (113) are configured to be assembled correspondingly to each one of the another insertion holes (123) and each one of the another insertion pins (122).

7. The terminal block (1) with the elastic retracting fixation member according to claim 1, wherein the cover (20A) comprises a bracket (21), a hollow column (22) extended from the bracket (21) and an anti-dust cover (27), the tool access hole (23) is disposed on a center of the hollow column (22), the anti-dust cover (27) is pivotally attached to the hollow column (22) and covers the tool access hole (23).

8. The terminal block (1) with the elastic retracting fixation member according to claim 1, wherein the cover member (20) comprises a bracket (21) and a hollow column (22) extended from the bracket (21), the tool access hole (23) is disposed on a center of the hollow column (22).

9. The terminal block (1) with the elastic retracting fixation member according to claim 8, wherein the bracket (21) arranged on an outer perimeter of the hollow column (22) comprises a plurality of latch hooks (24) extended therefrom, the elastic element (41) comprises a coil spring, the coil spring is mounted on the outer perimeter of the hollow column (22), and one end of the coil spring is latched and secured by each one of the latch hooks (24).

10. The terminal block (1) with the elastic retracting fixation member according to claim 8, wherein the insulation base (10) comprises a front housing (11) and a rear housing (12) assembled on the front housing (11) correspondingly, the cavity (13) and the cable insertion slot (14) are disposed between the front housing (11) and the rear housing (12), the bracket (21) comprises a plurality of locking hooks (25) extended therefrom, the front housing (11) and the rear housing (12) comprise a plurality of locking pieces (114, 124) extended therefrom respectively and provided for each one of the locking hooks (25) to be latched and secured thereon.

11. The terminal block (1) with the elastic retracting fixation member according to claim 10, wherein the bracket (21) includes a plurality of engagement axles (26) extended therefrom respectively, the front housing (11) and the rear housing (12) comprise a plurality of engagement slots (115, 125) extended thereon respectively, each one of the engagement axles (26) is inserted and secured correspondingly in each one of the engagement slots (115, 125).

12. The terminal block (1) with the elastic retracting fixation member according to claim 1, wherein the cover (20A) comprises a hollow column (22), the elastic retracting fixation member (40A) further comprises an inner sleeve (43), the elastic element (41A) is mounted on an outer circumference of the inner sleeve (43) and inserted in the hollow column (22) jointly with the inner sleeve (43).

13. The terminal block (1) with the elastic retracting fixation member according to claim 12, wherein the elastic retracting fixation member (40A) further comprises a bow spring (44), the fixation element (42) is clamped by the bow spring (44) and secured to the inner sleeve (43).

14. The terminal block (1) with the elastic retracting fixation member according to claim 12, wherein the hollow column (22) comprises a guiding slot (221), the inner sleeve (43) comprises a cylindrical body (431) and a protrusion (432), the protrusion (432) is configured to extend from one side of the cylindrical body (431) along a radial direction to cooperatively slide with respect to the guiding slot (221).

15. The terminal block (1) with the elastic retracting fixation member according to claim 14, wherein the inner sleeve (43) further comprises an upper flange (433) and a lower retaining hook (434), the upper flange (433) is configured to extend from a top end of the cylindrical body (431) along the radial direction, the lower retaining hook (434) is disposed on a bottom end of the cylindrical body (431).

16. The terminal block (1) with the elastic retracting fixation member according to claim 15, wherein an upper end and a lower end of the elastic element (41A) are arranged between the upper flange (433) and the lower retaining hook (434).

\* \* \* \* \*